United States Patent
Peterson et al.

(10) Patent No.: US 6,651,032 B2
(45) Date of Patent: Nov. 18, 2003

(54) SETTING DATA RETENTION THRESHOLDS IN CHARGE-BASED MEMORY

(75) Inventors: Jeffrey J. Peterson, Folsom, CA (US); David M. Dixon, Placerville, CA (US); Dow Ping D. Wong, Folsom, CA (US)

(73) Assignee: Intel Corporation, Santa Clara, CA (US)

( * ) Notice: Subject to any disclaimer, the term of this patent is extended or adjusted under 35 U.S.C. 154(b) by 373 days.

(21) Appl. No.: 09/809,622

(22) Filed: Mar. 15, 2001

(65) Prior Publication Data

US 2002/0133312 A1 Sep. 19, 2002

(51) Int. Cl.⁷ .................. G06F 101/14; G06F 15/00; G06F 17/18
(52) U.S. Cl. .................. 702/181; 365/201
(58) Field of Search .................. 365/201, 189.07, 365/185.2, 185.21, 185.24; 714/5, 718, 721; 702/57–58, 64, 66, 117–120, 124, 181–182

(56) References Cited

U.S. PATENT DOCUMENTS

| | | | | |
|---|---|---|---|---|
| 4,796,227 A | * | 1/1989 | Lyon et al. | 365/154 |
| 5,128,944 A | * | 7/1992 | Flaherty et al. | 714/6 |
| 5,414,632 A | * | 5/1995 | Mochizuki et al. | 700/174 |
| 5,581,510 A | * | 12/1996 | Furusho et al. | 365/201 |
| 5,606,518 A | * | 2/1997 | Fang et al. | 703/13 |
| 5,615,162 A | * | 3/1997 | Houston | 365/226 |
| 5,893,047 A | * | 4/1999 | Gimblett et al. | 702/33 |
| 6,330,697 B1 | * | 12/2001 | Clinton et al. | 714/721 |
| 6,397,247 B1 | * | 5/2002 | Shirakawa et al. | 709/223 |

OTHER PUBLICATIONS

Neal et al., "A 1Mb CMOS DRAM with Design–for–Test Functions", Feb. 21, 1986, 1986 IEEE International Solid–State Circuits Conference, pp. 264–265 and 367.*

* cited by examiner

Primary Examiner—Marc S. Hoff
Assistant Examiner—Mary Catherine Baran
(74) Attorney, Agent, or Firm—John F. Travis (57) ABSTRACT

Programming a reference voltage in a reference cell of a charge-based memory to a level that will maximize the predicted operational life of the memory, based on the application-specific predicted usage profile of the memory and the effects of that usage profile on the leakage curves of the various memory states. The different states of a memory cell may have different leakage rates, based on operational and environmental considerations, causing the cell to fail prematurely in one state, while having significant remaining life in the other state(s). The operational life of the memory can be increased by adjusting the reference threshold voltage so that the faster-leaking sate will last longer before failure occurs. Maximum operational life can be achieved by setting the reference voltage to maximize the predicted time-to-failure of the state with the shortest predicted time-to-failure.

30 Claims, 7 Drawing Sheets

SETTING DATA RETENTION THRESHOLDS IN CHARGE-BASED MEMORY

BACKGROUND OF THE INVENTION

1. Field of the Invention

The invention pertains generally to computers. In particular, it pertains to computer memories.

2. Description of the Related Art

Various types of semiconductor memory are used in computers, each with its own characteristics. Some types of memory are charge-based. Charge-based memories charge up a cell to a predetermined level that represents the desired logic state. For example, a logic '0' could be programmed by charging up the cell to a level above 1.5 volts, while a logic '1' could be represented by keeping the charge in the cell below 1.5 volts. In some types of memories, multiple states can be represented by defining multiple ranges of charge. For example, '11' might be represented by 0–1.5 volts, '10' by 1.6–3.0 volts, '01' by 3.1–4.5 volts, and '00' by greater than 4.6–6.0 volts.

Most charge-based memories are reprogrammable while in the circuit, and many retain their data for a period of time even when electrical power is removed from them. In the programming operation, each cell can be charged up to a given state. Because of the mechanism involved in charging or discharging, an erase operation is generally performed on a large number of cells at the same time. These types of memories are generically referred to as electrically erasable read only memory (EEPROM), of which flash memories are one type. With EEPROM's, an entire block of memory must generally be erased and reprogrammed whenever any of the contents of the block are to be changed.

Once a charge-based memory cell has been programmed, it is read by comparing the amount of charge in the cell with a reference threshold level. For example, if the threshold between a logic '0' and a logic '1' is 1.5 volts, a reference cell will be maintained at 1.5 volts. The voltage level in the cell being read is compared to the reference voltage. If it is less than that reference voltage level, it is determined to be in one state, while if above the reference voltage level, it is determined to be in another state.

Once a memory cell has been charged to a certain level, that charge can migrate away, or 'leak', until the remaining charge represents a different, i.e. incorrect, state. If the charge migrates until the voltage in the cell is approximately the same as the reference level, the logic state stored in the cell can be misread, resulting in a memory failure. This is especially a problem in multi-state memory cells, in which each of the states are compressed into a relatively small voltage range.

Different types of technology are able to retain data for different periods of time before failing in this manner. Flash memory can retain data for several years without any effort to renew the charge. The amount of time a memory cell will remain 'good', i.e., will reliably hold a charge within the desired range, depends not only on the technology used, but can also depend on the characteristics of the memory's usage. Flash memories, for example, begin to deteriorate after program/erase cycles due to a change in the rate of leakage. Other factors can also affect the rate of this leakage, such as the bias voltages used and the operating temperature. Even the size of the memory array is a consideration (a large array is statistically more likely to have a bad cell that leaks faster, and just one bad cell can be enough to cause the memory device to fail).

Figure 1A:
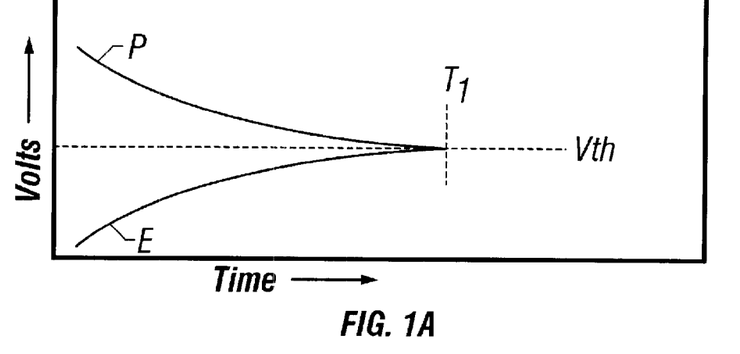

FIG. 1$a$ shows characteristic curves for conventional flash memory cells. In FIG. 1$a$, the charge level representing the programmed state P and the charge level representing the erased state E leak, so that over a period of time, both approach threshold reference voltage Vth. The memory device eventually fails at time T1, because the charge level in that cell can no longer be reliably distinguished from the threshold voltage in at least one of the states.

Figure 1B:
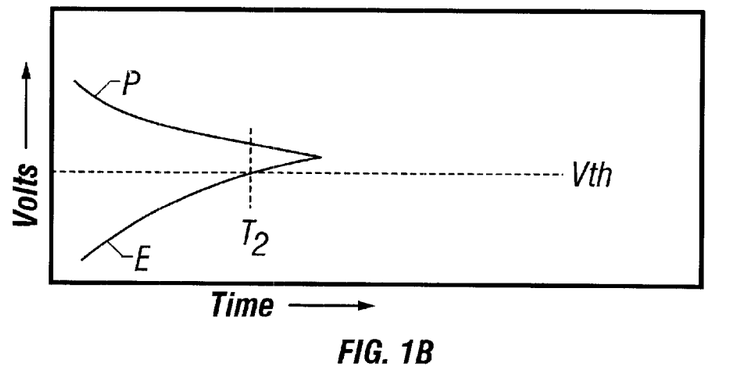
Figure 1C:
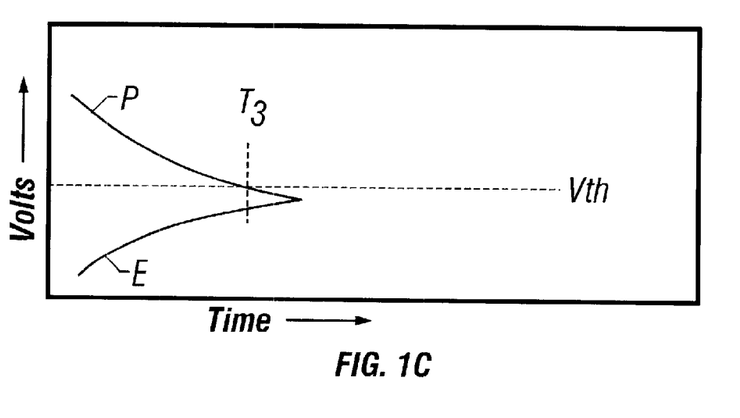

In FIG. 1$b$, due to the operational factors discussed above, the erased state leaks faster than the programmed state, and the device fails at time T2 because the erased state can no longer be distinguished from the reference voltage. Although the programmed state has a much longer lifetime remaining, the memory device is not functional if it cannot reliably distinguish both the programmed and erased states for all cells. In FIG. 1$c$, the programmed state deteriorates much faster than the erased state, so that the part fails at time T3, even though the erased state might be able to operate reliably for several more years.

In conventional memories, the reference voltage Vth is determined by assuming an average usage and deterioration, such as that shown in FIG. 1$a$. Because of this, actual usage profiles that follow the curves of FIG. 1$b$ or 1$c$ result in premature failure of the memory cells, because one of the states approaches the reference voltage threshold much faster than the other state.

BRIEF DESCRIPTION OF THE DRAWINGS

FIGS. 1$a$–1$c$ show the deterioration characteristics of a conventional charge-based memory.

FIGS. 2$a$–2$b$ show threshold values for single-state and multi-state cells.

FIGS. 3$a$–3$c$ show leakage curves for single-state and multi-state cells.

FIGS. 4$a$–4$b$ shows a comparison between various types of leakage curves for single-state cells.

DETAILED DESCRIPTION OF THE INVENTION

Various embodiments of the invention use a threshold reference voltage to fit the anticipated usage characteristics of the memory. Some embodiments provide a reference voltage from a memory cell, much like the addressable memory cells, but the reference cells are sealed off from further charge adjustments once they have been charged up to the desired reference thresholds. By determining the anticipated usage characteristics, or usage profile, of a given group of memory devices, each group can have its reference threshold set to maximize the memory's lifetime for those usage characteristics. A usage profile can consist of a combination of the various usage factors that are expected to affect the operation of a given memory, and the resulting effects on the leakage curves of that memory. Such factors can include bias voltages, the number of erase and/or program cycles, operating temperature, array size, and the underlying technology and materials of the memory.

Adjusting for the usage profile by charging up the reference cells to different levels is much easier and less expensive than changing reference schemes by design or during process fabrication. Although setting the reference voltage levels can typically be performed by the memory chip manufacturer, with inputs from the customers about anticipated usage, this step can also be performed further downstream by anyone in the manufacturing or distribution chain that has the proper equipment to program the reference voltage levels. Thus, this technique permits the customized reference levels to be set either by the memory chip manufacturer or by those that are closer to the end user and therefore are more familiar with the usage characteristics that are anticipated.

The various embodiments described herein are described in terms of flash memory. This is for illustration only, and the invention is equally applicable to other types of memory to place memory cells in different logic states, and then compare against predetermined references to determine what state a memory cell is in.

As is well known in the art, flash memory uses a transistor with a floating-gate to provide non-volatile storage for data. By using one set of bias voltages on the transistor, the charge on the floating gate can be eliminated or reduced to a minimal level (erased). By using a second set of bias voltages on the transistor, the floating gate can be charged up to a predetermined level (programmed). A third set of bias voltages on the transistor can be used to read the level of charge. The amount of charge on the floating gate affects the conductance of the transistor when it is read, so the read operation consists of placing the transistor in a read state and measuring either the current or voltage between the source and drain. This measured quantity is then compared with a reference to determine if the detected charge level is above or below a threshold value. The examples described herein use voltages as the relevant value, but a person of ordinary skill in the art can easily apply the same principles to currents or other forms of measuring the memory cell. The relevant quantity can be generically referred to a 'value', which can include voltage, current, or charge, depending on the parameters being used.

Figure 2A:
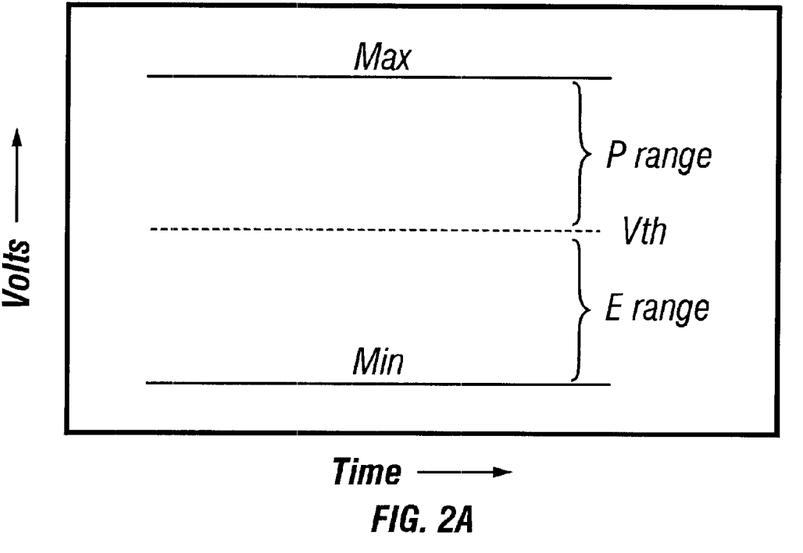

In a single-state memory cell, only a single data bit is stored. Since a data bit can actually have two states, one state may be considered the '1' state and the other state may be considered the '0' state. For convenience of illustration, the '1' state will be considered to represent an erased state, while the '0' state will be considered to represent a programmed state, but the opposite convention can also be used. Thus, the term "single-state memory cell" can refer to the number of programmed states available. Using a single threshold voltage as a reference, the read circuitry can determine if the measured voltage is above or below the reference voltage. FIG. 2a shows this for one embodiment of a single-state memory cell, in which the memory cell can be erased and programmed to produce a read voltage anywhere from the 'Min' to 'Max' levels. Reference voltage Vth is the threshold reference voltage. In this embodiment, if the addressed memory cell produces a read voltage between Vth and Min, it is considered to be in the erased state. If the addressed memory cell produces a read voltage between Vth and 'Max', it is considered to be in the programmed state.

Figure 2B:
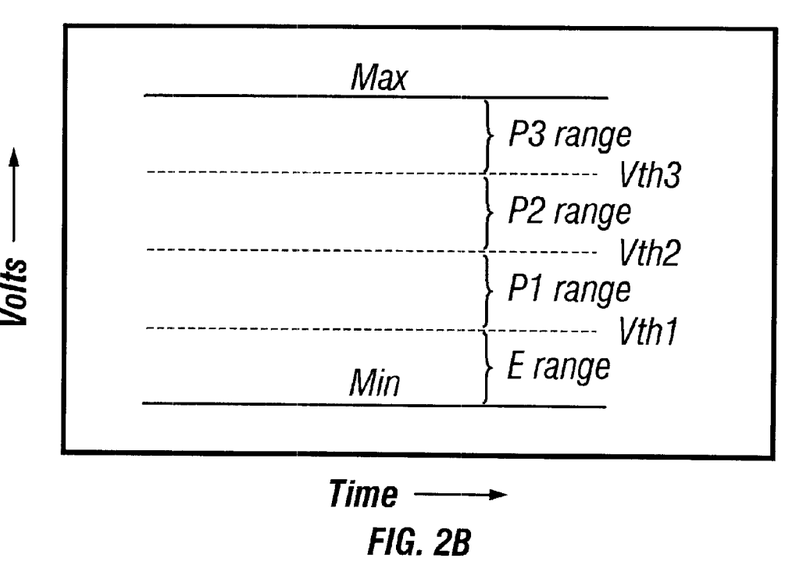

FIG. 2b provides a similar illustration for a multi-state memory cell that can represent four possible states, although other configurations are also possible. As in FIG. 2a, when erased and programmed, the floating gate of the transistor can be charged up to any level that produces a read voltage between 'Min' and 'Max'. Three different threshold voltages, Vth1, Vth1, and Vth3, divide this into four ranges. In this embodiment, a read voltage in the E range is considered to be in the erased state, while a read voltage in the P1 range is considered to be in the first programmed state. The P2 and P3 ranges represent the second and third programmed states. In one embodiment, the ranges E, P1, P2, and P3 can represent logic values 11, 10, 01, and 00, respectively, but other conventions can also be used, as is known in the art. Multi-state memory cells can therefore be used to store more than one logic bit per cell. The number of states that can be reliably represented in a single cell depends on the number of states that can be reliably programmed and read. As shown, multi-state cells can have narrower voltage ranges for each state than single-state cells, and the program/read operations should therefore be controlled more tightly, making them potentially more difficult and expensive to produce.

Flash memory cells can retain a charge for a long time, such as for several years. However, once programmed, this charge will inevitably leak, or migrate away from the floating gate with time, until the read voltage approaches one of the threshold voltage levels. When the read voltage comes so close to the threshold voltage that they cannot be reliably distinguished from each other, the state of the cell can be misread and the memory cell can fail. In one embodiment, this process may take several years, but the contents of many flash memories are frequently intended to remain unchanged for the lifetime of the product, and even a multi-year leakage rate may shorten the effective life of that product.

Figure 3A:
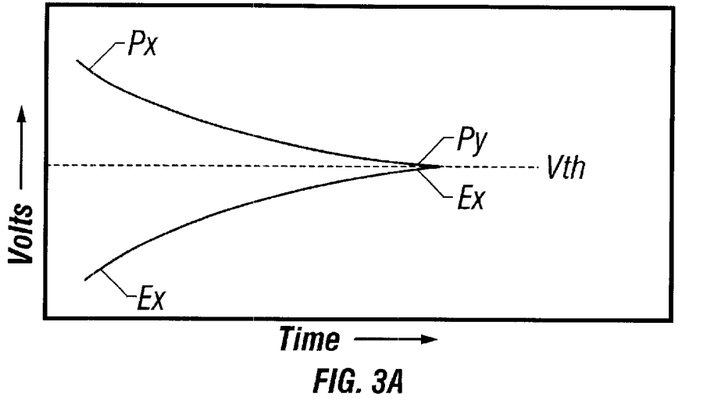
Figure 3B:
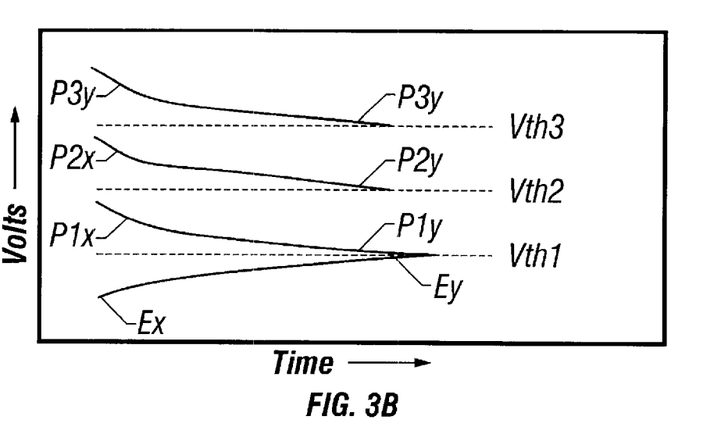
Figure 3C:
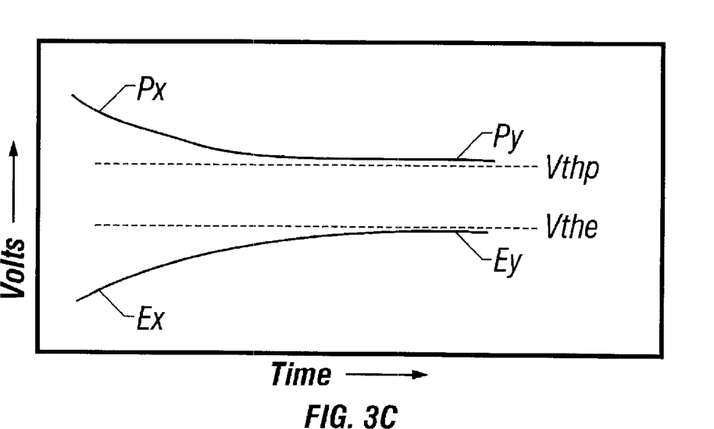

FIG. 3a shows this migration effect for single-state memory cells. The cells are initially programmed to voltage levels Ex for a logic '1' or Px for a logic '0'. But with time, as the charge leaks away from the floating gate, the read voltage of the cells can follow the curves to Ey and Py, respectively. Eventually, one of those voltages will come so close to Vth that it will not register as different than Vth, and the state of the memory cell will not be able to be reliably determined, resulting in failure of the memory cell. Since a failure of only one cell can effectively result in a failure of the entire memory, the worst-case cell may determine the lifetime of the entire system. FIG. 3b shows the same thing for a multi-state memory cell, with the voltages Ex, P1x, P2x, and P3x gradually declining to Ey, P1y, P2y, and P3y, respectively. In the illustrated embodiment, the voltage in the erased state drifts in an upward direction, while the voltages in the three programmed states all drift in a downward direction. This directional orientation can be dependent on the particular bias voltages being used, the materials in the memory cell, and other factors, so the direction of drift can be different in other embodiments. Regardless of the direction of drift, the voltage of an erased or programmed state can eventually approach a threshold value and result in a memory failure. In some embodiments, the memory can include two separate reference cells for two separate thresholds between two states, such as shown in FIG. 3c, where Vthp represents the lower threshold for the programmed cells, and Vthe represents the upper threshold for the erased cells. This provides a guard band between states in which neither state is valid, thus allowing separate control over the allowable boundaries of each state.

The rate at which an erased or programmed state drifts can depend on a number of factors, such as the bias voltages used, the number of erase/program cycles performed on the cell, the temperature of the device, the materials used in making the memory, the type of memory product, and others. Each of these factors may affect the erased state more or less than the programmed state, or in a multi-state cell may affect some programmed states more than others. Because of this, the voltage in one state may drift faster than the voltage in another state, as was previously shown in FIGS. 1a–1c, causing a premature memory failure. Statistically, a large number of memory cells are more likely to contain a deficient cell that drifts faster than the average, resulting in an earlier memory failure. Since the failure of a single cell is generally enough to cause the entire memory to be considered unreliable, a large memory array may be predicted to have an effectively greater rate of drift and effectively shorter time-to-failure than a smaller memory array.

All of these factors can be included in the 'usage profile' for a given memory, and a predicted rate of drift can be determined for each erased or programmed level. The specifics of making these predictions is known in the art and is not further described to avoid obscuring the invention. A graph of the predicted drift is known as the leakage curve. The leakage curves for one embodiment of single-state memory is shown in FIG. 3a, while the leakage curves for one embodiment of multi-state memory is shown in FIG. 3b. In these two examples, the reference voltages Vth (FIG. 3a) and Vth1, Vth2, Vth3 (FIG. 3b) can be adjusted to maximize the time it takes for each curve to reach its associated reference voltage, and theoretically maximize the predicted lifetime of the memory. In a conventional memory, the same 'average' usage curves are used to set the same Vth (or Vth1, Vth2, Vth3, etc.) in all the memories. This average may be based on an anticipated average usage profile for the industry, or may be based on simple assumptions about voltage drift, but all the memories are manufactured with the same set of reference voltages, based on this average profile. If the actual usage profile for particular group of memories is different than this average profile, the actual memory cells may drift in a different direction/amount than predicted, and one of the voltage states may fail much sooner than predicted.

Figure 4A:
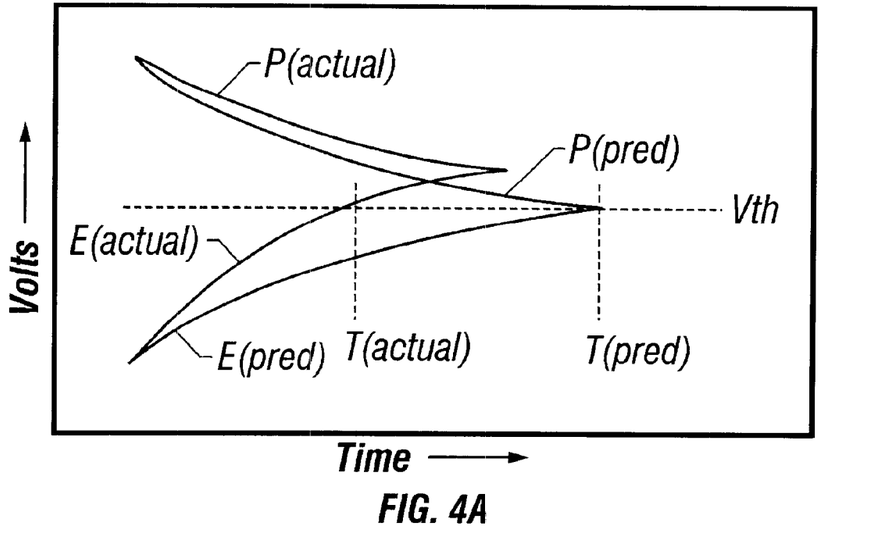

FIG. 4a shows the leakage curves for a single-state memory in which the actual leakage curves P(actual) and E(actual) are different than the predicted leakage curves P(pred) and E(pred) that were used to set the level of Vth when the memory was manufactured. As a result, the erased state, and the memory, experiences a failure earlier than expected, failing at time T(actual) rather than at the predicted time T(pred). This difference may be as much as several years, greatly shortening the life of the memory product.

Figure 4B:
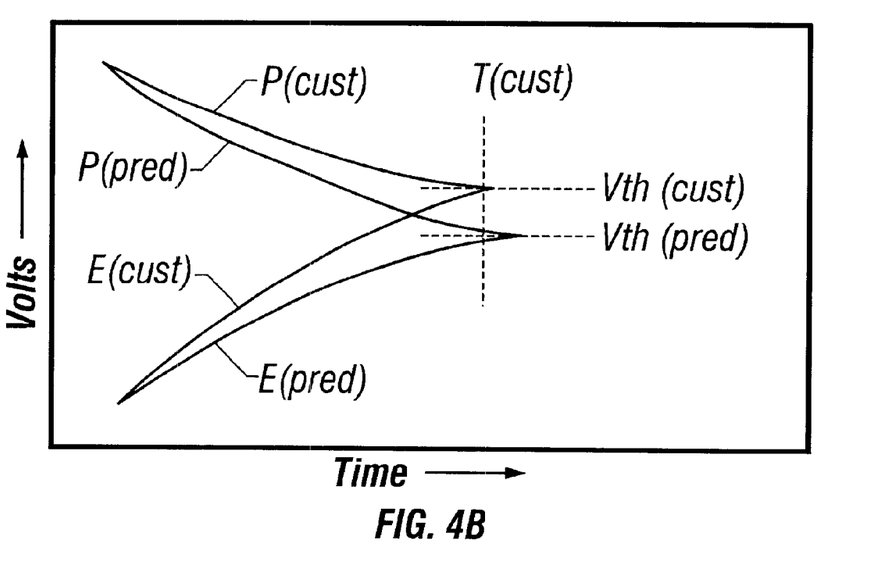

In various embodiments of the invention, a customized usage profile based on anticipated usage conditions can be used to calculate the predicted usage curves. For example, different equipment makers may use different bias voltage to bias the flash memories. A flash memory used to store telephone numbers in a cell phone may see many more erase/program cycles than the BIOS in a personal computer. A flash memory in an automobile may see greater temperature extremes than one in an office product. Each of these examples produces a different application-specific usage profile that results in different leakage curves, and the memories manufactured for each can use different reference voltages. The memories manufactured for an application that produces a particular usage profile can be made using predicted leakage curves that are based on this particular usage profile. Based on this, the point at which the customized curves for E(cust) and P(cust) meet can be used to set the Vth threshold for that group of memories. FIG. 4b shows how the custom-predicted curves P(cust) and E(cust) differ from the conventionally predicted curves P(pred) and E(pred). The threshold voltage Vth(cust) that is programmed into the reference cell can then be set to match the point at which P(cust) and E(cust) meet each other in FIG. 4b, rather than at the conventional predicted threshold voltage Vth (pred). Vth(cust) can be the point at which the operational lifetime of the memory will be maximized, since any other level of Vth will intersect either the P(cust) or E(cust) curve at an earlier time, resulting in earlier failure of the memory.

Figure 5:
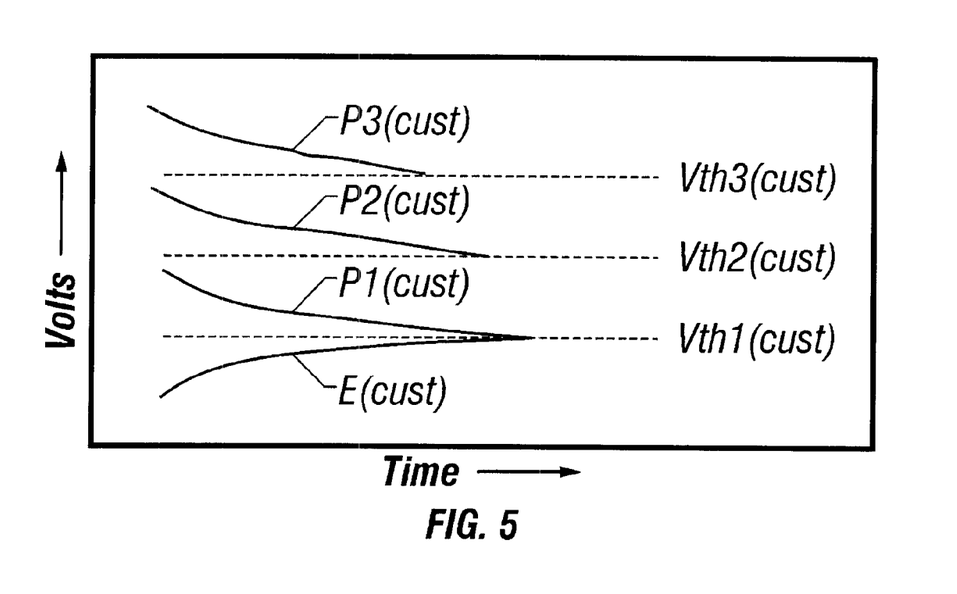
FIG. 5 shows threshold values adjusted for customized leakage curves.
Figure 6:
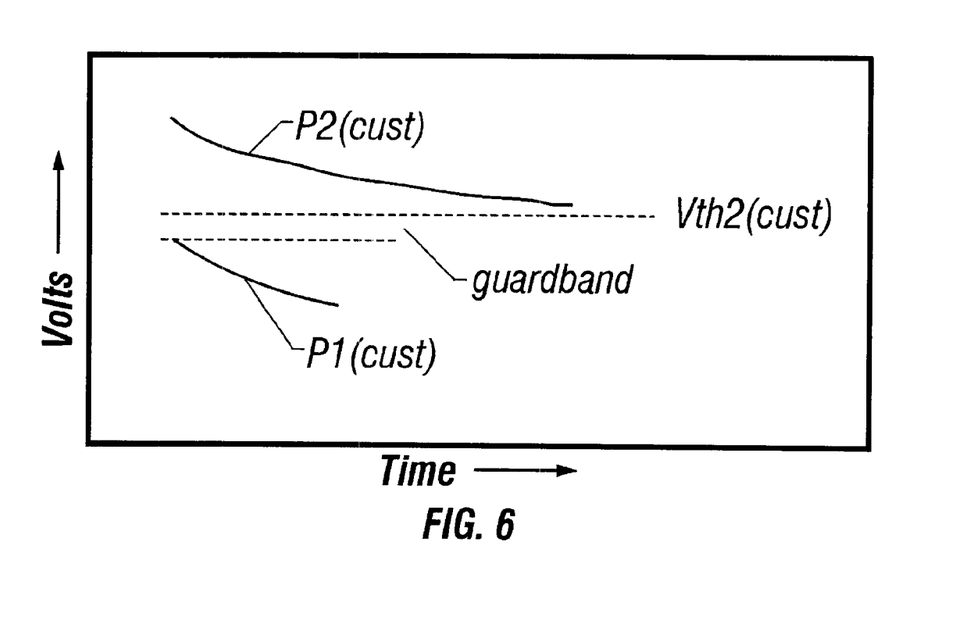
FIG. 6 shows the use of guard bands with customized leakage curves.

Although the illustrations of FIGS. 4a and 4b are based on single-state memory cells, other embodiments can use the same principles to determine the set-points for multiple thresholds in multi-state memory cells. FIG. 5 shows custom, or application-specific, usage curves for a multi-state memory, in which E(cust), P1(cust), P2(cust), and P3(cust) have all been calculated based on the anticipated usage profile for a given application. Each threshold value can be individually determined by considering the leakage curve that approaches that threshold value over time. However, this may not be the only consideration. The expected time-to-failure of the memory will be the earliest time at which any of the leakage curves reaches any threshold value, since a failure to correctly read any state results in a failure of the cell and may effectively result in a failure of the entire memory. Care should be exercised to insure that the threshold value for one state does not overlap the starting point of the leakage curve for another state. FIG. 6 shows an embodiment in which threshold values are set by applying a 'guard band' between each curve and its bordering threshold value. This may be necessary because process variations and measurement inaccuracies can create a certain amount of uncertainty between the desired values and the actual values that are manufactured into the memories. The guard bands permit these uncertainties to occur without the danger that they will cause a threshold value and a programmed or erased state to unintentionally overlap, creating an immediate failure. FIG. 6 illustrates the principle by showing how P1, P2, and Vth2(cust) can be related. Ideally, Vth2(cust) can be selected to maximize the length of time that passes before P2 intersects Vth2(cust) and causes a memory failure. However, in some embodiments, the initial starting point for P1(cust) is also separated from Vth2(cust) by a predefined amount so that process variations and/or measurement inaccuracies will not inadvertently cause an overlap between P1(cust) and Vth2(cust), which would result in an immediate failure when programmed state P1 was read incorrectly as programmed state P2. This separation amount is the guard band, which can be determined by known techniques.

Figure 7:
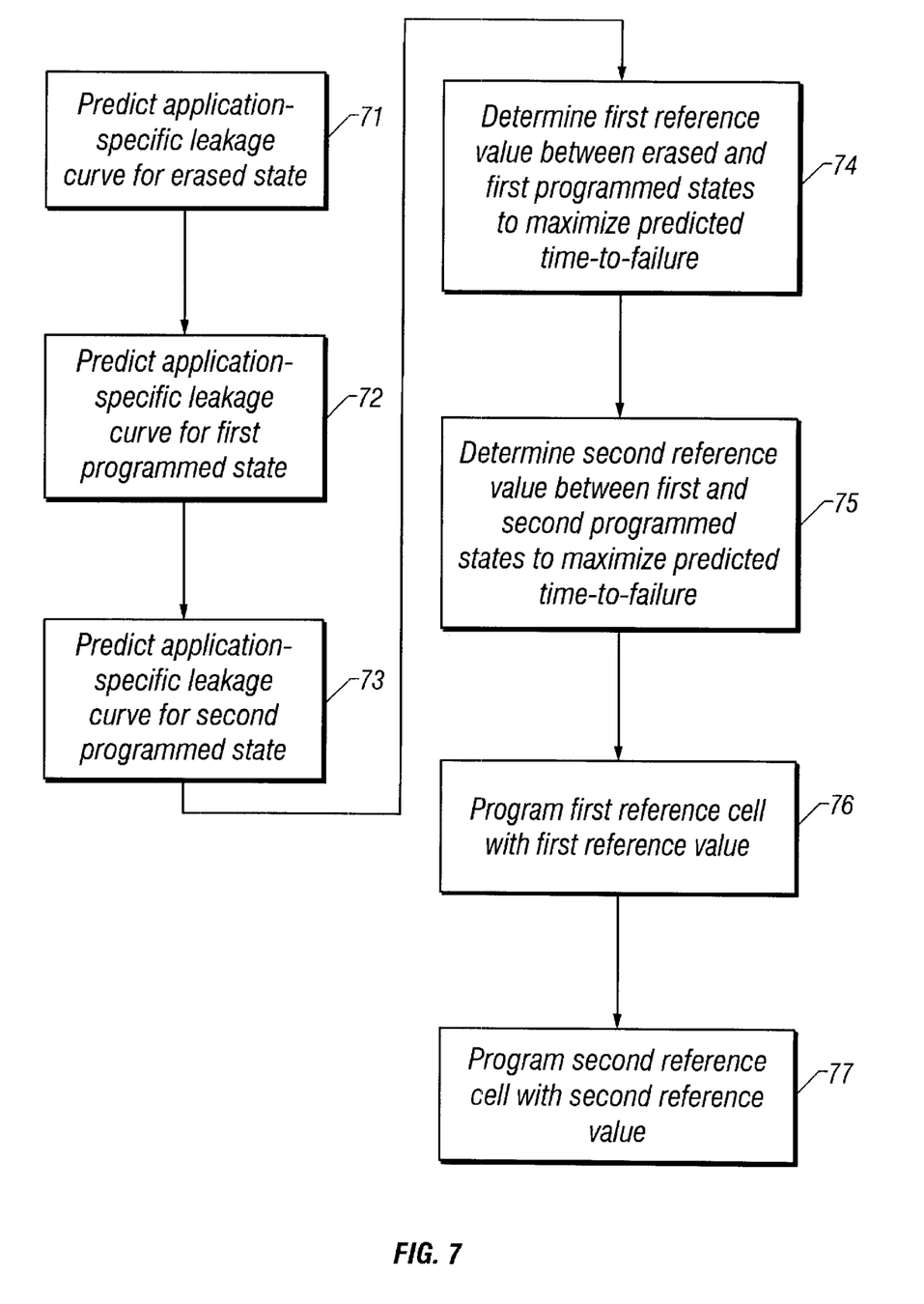
FIG. 7 shows a flow chart of a method.

FIG. 7 shows a flow chart of a method embodiment. At block 71, a leakage curve for the erased state is predicted, based on the application-specific usage profile. This usage profile can be based on the expected bias voltages, operating temperatures, erase/program cycles, materials technology, array size, and other factors that are specific to the application that is expected for the particular memory. At blocks 72 and 73, application-specific leakage curves are similarly predicted for first and second programmed states. This assumes two programmed states. The method for a single programmed state would eliminate block 73, while the method for additional programmed states would add blocks to predict those additional programmed states. Although each leakage curve is shown as a separate prediction, an integrated prediction algorithm can also be employed to interactively predict all the necessary leakage curves. At block 74, a reference value is determined, based on the aforementioned leakage curves, that will maximize the predicted time-to-failure of the memory by maximizing the shortest of the erased state time-to-failure and the first programmed state time-to-failure. If a second programmed state is to be used, a second reference value is determined at block 75 that will maximize the predicted time-to-failure of the memory by maximizing the shortest of the first programmed state time-to-failure and the second programmed state time-to-failure. At blocks 76 and 77, the reference values are programmed into reference cells in the memory. As before, the number of reference cells will depend on the number of states to be programmed into the addressable memory cells, and the flow chart of FIG. 7 can be adjusted as needed.

Figure 8:
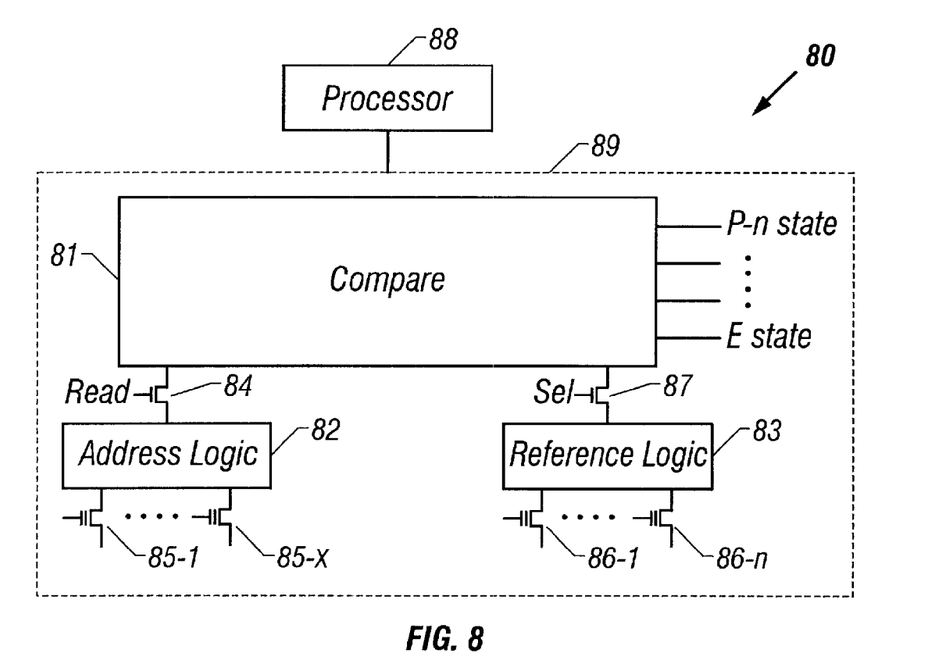
FIG. 8 shows a memory apparatus and system.

FIG. 8 shows a logic diagram of a memory 89. Transistors 85-1 through 85-x represent the addressable cells of the memory, which can number between a few cells and a few million cells, depending on the memory. Various embodiments of the memory can include flash memory, ferroelectric memory, dynamic random access memory, and other memory technologies. Each cell can be placed in the erased state or in one of the programmed states to represent the particular logic state desired. Address logic 82 can permit individual cells to be addressed for a read operation, while transistor 84 can be turned on to pass the detected voltage or current from the addressed cell to compare logic 81. Transistors 86-1 through 86-n represent the reference cells, with each one being charged to its predetermined threshold value. For a single-state memory embodiment, there may be one reference cell, while for a multi-state memory embodiment, there may be two or more such reference cells. Reference logic 83 can select one of the reference cells for comparison with the addressed memory cell, while transistor 87 can pass on the voltage or current from the selected reference cell to compare logic 81, which can compare the value from the addressed memory cell with that of the selected reference cell. In the illustrated embodiment, each reference cell can be selected in turn so that the state of the addressed memory cell can be determined by sequentially comparing it with each reference cell. In another embodiment, the addressed memory cell can be compared with all reference cells simultaneously by providing multiple comparison circuits in parallel in compare logic 81. Regardless of the approach used, when the comparison is finished, compare logic 81 can assert one of outputs E, P1 . . . Pn to indicate which memory state the addressed memory cell is in. For a single-state memory, there may be one P output from compare logic 81, while for a multi-state memory there may be two or more P outputs. In another embodiment, the output of compare logic 81 can be a binary number representing the detected state. Alternate embodiments may have multiple erased states.

Reference cells 86-1 through 86-n can each be programmed to maximize the predicted time-to-failure of the memory, based on application-specific usage profiles for the application into which the memory is expected to be placed. Memory 89 can also be part of a system 80, which includes processor 88.

Since the threshold values in the reference cells can be easily customized with the embodiments described herein, different types of memory can be placed on the same integrated circuit die, or in the same multi-chip module, with similar reference cells being provided for each, but programmed to different levels to accommodate the different characteristics and usage profiles of the different memory types.

Various embodiments of the invention can include an apparatus, a system, a method, and a product made from the process method.

The foregoing description is intended to be illustrative and not limiting. For example, the erased state in the description can be referred to as another programmed state. Such differences in labeling would be obvious to a person of ordinary skill in the art and are intended to be included in the embodiments of the invention. Other variations will also occur to those of skill in the art. Those variations are intended to be included in the invention, which is limited only by the spirit and scope of the appended claims.

We claim:

1. A method, comprising:
   predicting a first leakage curve for a first state in a memory, based on a predicted application-specific usage profile for the memory;
   predicting a second leakage curve for a second state in the memory, based on the predicted application-specific usage profile for the memory;
   determining a first reference value to compare with at least one of the first and second states, said determining to be used to increase a predicted operational life of the memory, based on at least one of the first and second predicted leakage curves; and
   programming a first reference circuit with the first reference value.

2. The method of claim 1, wherein:
   said programming a first reference circuit includes programming a first reference memory cell.

3. The method of claim 1, wherein the predicted operational life is a shorter of an estimated time-to-failure of the first state and an estimated time-to-failure of the second state.

4. The method of claim 1, wherein:
   said predicting the first leakage curve includes predicting a leakage curve for an erased state.

5. The method of claim 1, wherein:
   said predicting the second leakage curve includes predicting a leakage curve for a first programmed state.

6. The method of claim 5, further comprising:
   predicting a third leakage curve for a third state in the memory, based on the predicted application-specific usage profile of the memory;
   determining a second reference value to be used to increase the predicted operational life of the memory, based on at least the third predicted leakage curve; and
   programming a second reference circuit with the second reference value.

7. The method of claim 6, wherein:
   said predicting the third leakage curve includes predicting the leakage curve for a second programmed state.

8. The method of claim 6, wherein:
   said programming a second reference circuit includes programming a second reference memory cell.

9. The method of claim 1, wherein:
   the memory is a charge-based memory.

10. The method of claim 1, wherein:
    said determining the first reference value to increase the predicted operational life of the memory includes determining a first reference value to maximize the predicted operation life of the memory.

11. An apparatus, comprising:
    a memory including
       a plurality of addressable memory cells;
       a first reference circuit to produce a predetermined first reference value; and
       a first comparison circuit coupled to the plurality of memory cells and to the first reference circuit to determine if an addressed one of the plurality of memory cells is programmed to a first level greater than or a second level less than the predetermined first reference value;
wherein the predetermined first reference value is selected to increase a predicted time-to-failure of the memory, based on an application-specific usage profile for the memory.

12. The apparatus of claim 11, wherein the memory is one of a flash memory, a ferro-electric memory, and a dynamic random access memory.

13. The apparatus of claim 11, wherein the predicted time-to-failure of the memory is a shorter of:
a predicted time-to-failure for a first portion of the plurality of memory cells in a first state; and
a predicted time-to-failure for a second portion of the plurality of memory cells in a second state.

14. The apparatus of claim 11, further comprising:
a second reference circuit to produce a predetermined second reference value; and
a second comparison circuit coupled to the plurality of memory cells and to the second reference circuit to determine if the addressed one of the plurality of memory cells is programmed to a third level greater than or a fourth level less than the predetermined second reference value;
wherein the predetermined second reference value is selected to increase the predicted time-to-failure of the memory, based on the application-specific usage profile for the memory.

15. The apparatus of claim 11, wherein:
the predicted first reference value is selected to maximize the predicted time-to-failure of the memory, based on the application-specific usage profile for the memory.

16. A system, comprising:
a processor;
a memory coupled to the processor and including
a plurality of addressable memory cells;
a first reference circuit to produce a predetermined first reference value; and
a first comparison circuit coupled to the plurality of memory cells and to the first reference circuit to determine if an addressed one of the plurality of memory cells is programmed to a first level greater than or a second level less than the predetermined first reference value;
wherein the predetermined first reference value is selected to increase a predicted time-to-failure of the memory, based on an application-specific usage profile for the memory.

17. The system of claim 16, wherein the memory is one of a flash memory, a ferro-electric memory, and a dynamic random access memory.

18. The system of claim 16, wherein the predicted time-to-failure of the memory is a shorter of:
an estimated time-to-failure for a first portion of the plurality of memory cells in a first state; and
an estimated time-to-failure for a second portion of the plurality of memory cells in a second state.

19. The system of claim 16, further comprising:
a second reference circuit to produce a predetermined second reference value; and
a second comparison circuit coupled to the plurality of memory cells and to the second reference circuit to determine if the addressed one of the plurality of memory cells is programmed to a third level greater than or a fourth level less than the predetermined second reference value;
wherein the predetermined second reference value is selected to increase the predicted time-to-failure of the memory, based on the application-specific usage profile of the memory.

20. The system of claim 16, wherein:
the predetermined first reference value is selected to maximize the predicted time-to-failure of the memory, based on the application-specific usage profile for the memory.

21. A memory made with a process comprising:
predicting a first leakage curve for a first state in the memory, based on an anticipated application-specific usage profile for the memory;
predicting a second leakage curve for a second state in the memory, based on the anticipated application-specific usage profile for the memory;
determining a first reference value to increase a predicted operational life of the memory, based on the first and second predicted leakage curves; and
programming a first reference circuit with the first reference value.

22. The memory of claim 21, wherein:
said programming a first reference circuit includes programming a reference memory cell.

23. The memory of claim 21, wherein:
the operational life is a shorter of an estimated time-to-failure of the first state and an estimated time-to-failure of the second state.

24. The memory of claim 21, wherein:
said predicting the first leakage curve includes predicting a leakage curve for an erased state.

25. The memory of claim 21, wherein:
said predicting the second leakage curve includes predicting a leakage curve for a first programmed state.

26. The memory of claim 21, wherein the process further comprises:
predicting a third leakage curve for a third state in the memory, based on the anticipated application-specific usage profile of the memory;
determining a second reference value to increase the predicted operational life of the memory, based on the second and third predicted leakage curves; and
programming a second reference circuit with the second reference value.

27. The memory of claim 26, wherein:
said predicting the third leakage curve includes predicting the leakage curve for a second programmed state.

28. The memory of claim 26, wherein:
programming a second reference circuit includes programming a reference memory cell.

29. The memory of claim 26, wherein:
said determining a second reference value to increase the predicted operational life of the memory includes determining a second reference value to maximize the predicted operation life of the memory.

30. The memory of claim 21, wherein:
the memory is a charge-based memory.

* * * * *

UNITED STATES PATENT AND TRADEMARK OFFICE
CERTIFICATE OF CORRECTION

PATENT NO.     : 6,651,032 B2
DATED          : November 18, 2003
INVENTOR(S)    : Peterson et al.

It is certified that error appears in the above-identified patent and that said Letters Patent is hereby corrected as shown below:

<u>Title page,</u>
Item [57], ABSTRACT,
Line 12, delete "sate", insert -- state --.

Signed and Sealed this

Third Day of February, 2004

JON W. DUDAS
*Acting Director of the United States Patent and Trademark Office*